United States Patent [19]
Trafton

[11] Patent Number: 5,442,311
[45] Date of Patent: Aug. 15, 1995

[54] SYSTEM AND METHOD FOR CONTROLLING A GAIN CIRCUIT

[75] Inventor: Fredrick W. Trafton, Garland, Tex.

[73] Assignee: Texas Instruments Incorporated, Dallas, Tex.

[21] Appl. No.: 187,954

[22] Filed: Jan. 28, 1994

[51] Int. Cl.[6] ............................ H03L 5/00; G06F 7/556
[52] U.S. Cl. ............................................ 327/306; 327/346
[58] Field of Search ............... 327/346, 350, 362, 334, 327/306, 331, 333, 560; 330/254

[56] References Cited

U.S. PATENT DOCUMENTS

| | | | |
|---|---|---|---|
| 4,331,929 | 5/1982 | Yokoyama | 330/252 |
| 5,162,678 | 11/1992 | Yamasaki | 327/331 |
| 5,220,219 | 6/1993 | Barber | 327/350 |
| 5,248,945 | 9/1993 | Atkinson | 330/252 |

*Primary Examiner*—Timothy P. Callahan
*Assistant Examiner*—Toan Tran
*Attorney, Agent, or Firm*—W. Daniel Swayze, Jr.; W. James Brady, III; Richard L. Donaldson

[57] ABSTRACT

A circuit (12) for controlling the gain of a gain cell (14) is provided. Circuit (12) comprises a circuit (16) for generating a control current. A circuit (22) generates a reference voltage. A circuit (18) uses the reference voltage to generate a first control voltage. A circuit (20) uses the control current to generate a second control voltage. The first and second control voltages comprise a differential control output of circuit (12). The gain of the gain cell is exponentially related to the control current.

20 Claims, 1 Drawing Sheet

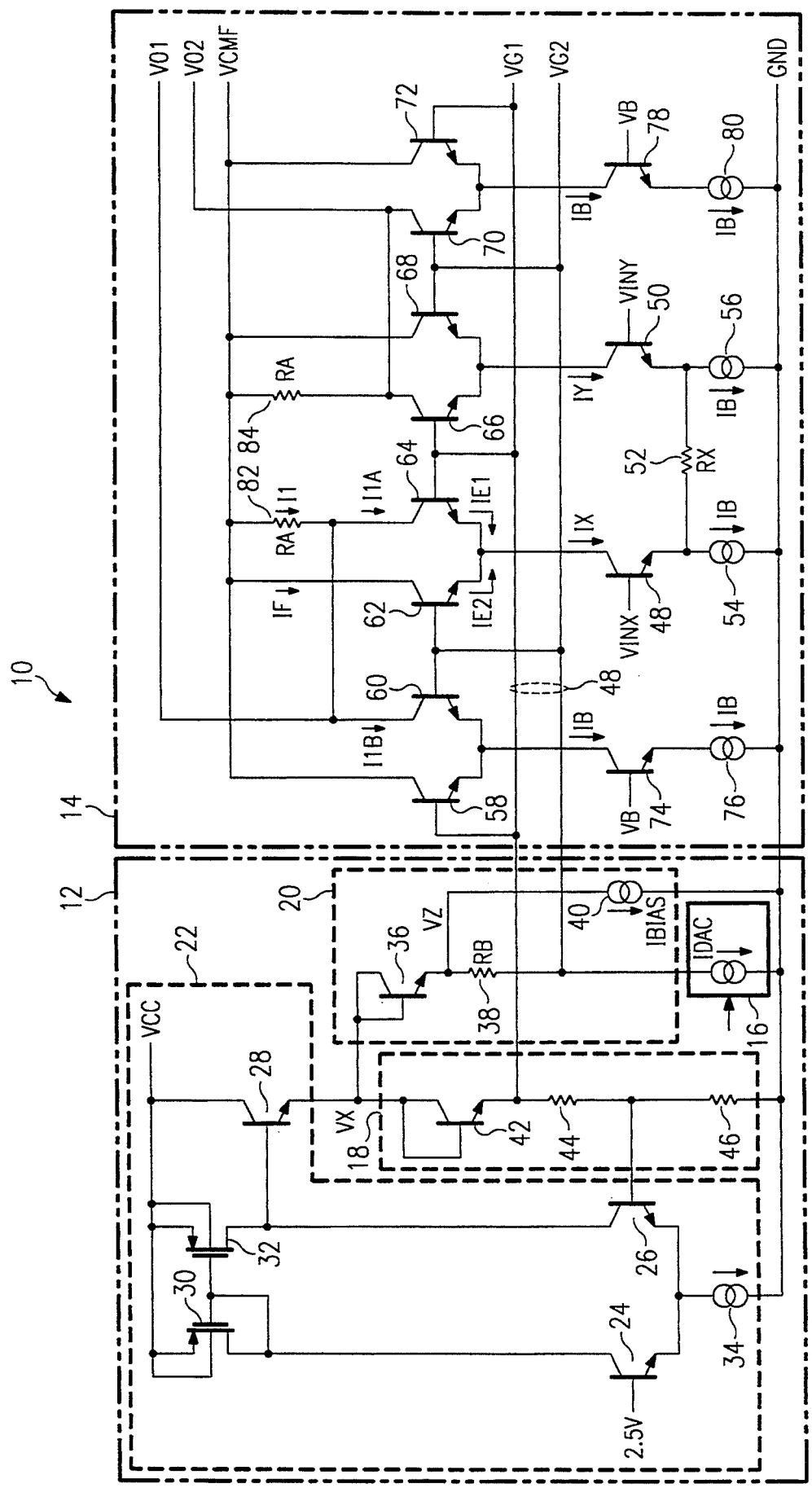

SYSTEM AND METHOD FOR CONTROLLING A GAIN CIRCUIT

TECHNICAL FIELD OF THE INVENTION

This invention relates in general to the field of electronic devices. More particularly, this invention relates to a system and method for controlling a gain circuit.

BACKGROUND OF THE INVENTION

It is often necessary to adjust the gain of an electrical circuit to compensate for an input signal that varies in intensity. Typically, the gain control signal is linearly related to the gain of the circuit. However, in some circumstances, an exponential relationship between the control signal and the gain of the circuit may be required. For example, an exponential relationship may be necessary if the gain circuit is to be used to create a linear change in a signal representing a decibel level. In such a circuit, the gain of the circuit should be approximately exponential in relationship to the control signal.

Existing systems and methods for controlling the gain of a gain circuit typically use a single-ended control signal. Furthermore, such existing systems and methods typically are used in conjunction with a gain circuit having a single-ended input and a single-ended output. The output of such existing systems and methods may vary with changes in temperature.

SUMMARY OF THE INVENTION

In accordance with the present invention, a system and method for controlling a gain circuit is provided which substantially eliminates or reduces disadvantages and problems associated with prior systems and methods. More particularly, one embodiment of the present invention controls the gain of a gain cell with a control current. The system comprises a circuit for generating a control current and a circuit for establishing a reference voltage. The system generates a differential control signal using the control current and reference voltage. The system comprises a circuit for generating a first output control voltage and a circuit for generating a second output control voltage. The first and second control voltages comprise the differential control signal. The control signal is a function of the control current. The differential control signal is provided to a gain circuit. Ultimately, the gain of the gain circuit is exponentially related to the control current of the system.

A technical advantage of the present invention inheres in the fact that the gain of the differential gain circuit is not affected by temperature. Therefore, the gain of the gain circuit should not vary with changes in the temperature of the operating environment.

Another technical advantage of the present invention inheres in the fact that it provides differential control of a differential gain circuit using a single-ended control current. The gain control circuit of the present invention converts a digital code word to an analog current. The control circuit uses the control current to create differential control signals that produce a percentage change in gain of the gain cell for a unit change in input current.

BRIEF DESCRIPTION OF THE DRAWINGS

For a more complete understanding of the present invention and the advantages thereof, reference is now made to the following description taken in conjunction with the accompanying drawing:

FIG. 1 illustrates a gain circuit constructed according to the teachings of the present invention.

DETAILED DESCRIPTION OF THE INVENTION

FIG. 1 illustrates a gain circuit indicated generally at 10 and constructed according to the teachings of the present invention. Gain circuit 10 may, for example, be used in an application wherein it is desired to create a linear change in a logarithmic function. Gain circuit 10 is designed such that the output of gain circuit 10 is relatively insensitive to the temperature of the operating environment. Gain circuit 10 comprises a control circuit 12 and a gain cell 14. Gain cell 14 may comprise, for example, a Gilbert translinear circuit such as the Gilbert Multiplier Cell as shown in FIG. 1. Gain cell 14 comprises a differential input and a differential output. Alternatively, gain cell 14 may comprise any other appropriate gain circuit having a differential control input.

Control circuit 12 generates a differential control signal which exponentially controls the gain of gain cell 14. Control circuit 12 comprises a circuit 16 for generating a control current, circuits for generating first and second control voltages 18 and 20, respectively, and a circuit 22 for establishing a reference voltage.

Circuit 16 generates a control current for control circuit 12. Circuit 16 may receive, for example, a digital code word that is logarithmicly related to the desired gain of circuit 10. Circuit 16 may comprise, for example, a digital-to-analog converter operable to convert the digital code word to an analog current. Alternatively, circuit 16 may produce an analog current having a logarithm proportional to the gain of gain circuit 10.

Circuit 22 sets a reference voltage for use by first and second control voltage circuits 18 and 20. Circuit 22 may comprise, for example, first, second, and third NPN bipolar junction transistors, 24, 26, and 28, respectively, first and second P-Channel MOSFET transistors 30 and 32, and a current source 34. An emitter of transistors 24 and 26 may be coupled together. Additionally, current source 34 may be coupled between a ground potential and the emitters of transistors 24 and 26. Transistors 30 and 32 may be coupled in a configuration so as to form a current mirror. For example, a source of each transistor 30 and 32 may be coupled to a power supply. A drain of transistor 30 may be coupled to a gate of transistor 30. Furthermore, a drain of transistor 30 may be coupled to a collector of transistor 24. A drain of transistor 32 may be coupled to both a collector of transistor 26 and a base of transistor 28. Finally, a collector of transistor 28 may be coupled to a power supply and a emitter of transistor 28 may be coupled to both first and second control voltage circuits 18 and 20. A voltage applied to a base of transistor 24 is replicated at a base of transistor 26 because circuit 22 operates essentially as an operational amplifier.

Circuits 18 and 20 establish first and second control voltages for control circuit 12. Circuit 18 operates to establish the first control voltage of control circuit 12. Circuit 18 may comprise, for example, an NPN bipolar junction transistor 42, and first and second resistors 44 and 46. A base of transistor 42 may be coupled to a collector of transistor 42 and an emitter of transistor 28. An emitter of transistor 42 may be coupled to a first end of resistor 44. Resistor 46 may be coupled between a second end of resistor 44 and a ground potential. A base of transistor 26 may be coupled to a second end of resistor 44. As described previously, a voltage applied at the base of transistor 24 is replicated at the base of transistor 26. Therefore, the voltage provided by circuit 22 establishes a current in resistor 46 and thereby establishes a current in circuit 18. The first control voltage, labelled VG1, comprises the voltage at the emitter of transistor 42.

Circuit 20 establishes a second control voltage. Circuit 20 may comprise, for example, an NPN bipolar junction transistor 36, a resistor 38, and a current source 40. A base of transistor 36 may be coupled to a collector of transistor 36 such that transistor 36 operates as a diode. Additionally, a base of transistor 36 may be coupled to an emitter of transistor 28 of circuit 22. Resistor 38 is coupled between an emitter of transistor 36 and control current circuit 16 such that the control current flows through resistor 38. A node connecting resistor 38 and circuit 16 comprises the second control voltage and is labeled VG2.

In operation, control circuit 12 may receive a digital code word at control current circuit 16. Circuit 16 may convert the code word to an analog control current. Additionally, reference voltage generating circuit 22 may receive a reference voltage at the base of transistor 24. This voltage is replicated at the base of transistor 26 and provided to first control voltage circuit 18. Based on the current generated by circuit 16 and the voltage generated by circuit 22, first and second control voltage generating circuits 18 and 20 generate a differential voltage output 48 equal to VG1-VG2.

Gain cell 14 may comprise for example, a Gilbert Multiplier Cell as shown in FIG. 1. Alternatively, gain cell 14 may comprise any other appropriate gain cell for providing an exponential gain in response to the control current of circuit 16. Gain cell 14 may receive a differential input signal at a base of transistors 48 and 50. Transistors 48 and 50 may comprise, for example, NPN bipolar junction transistors. An emitter of transistors 48 and 50 may be coupled through a resistor 52. Additionally, the emitter of each transistor 48 and 50 may be coupled to a ground potential through a current source 54 and 56 respectively.

Gain cell 14 may comprise an additional eight NPN bipolar junction transistor coupled together in pairs. For example, transistors 58 and 60, 62 and 64, 66 and 68, and 70 and 72 may be coupled together at the emitters of the respective pairs. The emitters of transistors 58 and 60 may be coupled to the collector of a transistor 74. Transistor 74 may also comprise an NPN bipolar junction transistor. A bias voltage may be applied to the base of transistor 74. A current source 76 may be coupled between an emitter of transistor 74 and a ground potential. Similarly, the emitters of transistor 70 and 72 may be coupled to a collector of transistor 78. Transistor 78 may comprise an NPN bipolar junction transistor. Additionally, a bias voltage may be applied to the base of transistor 78. A current source 80 may be coupled between an emitter of transistor 78 and a ground potential.

Resistors 82 and 84 may be coupled between a voltage labelled VCMF, and a collector of transistors 64 and 66. Furthermore, a collector of transistors 58, 62, 68 and 72 may be coupled to voltage VCMF. The collector of transistors 60 and 64 may be Coupled together. Similarly, the collector of transistors 60 and 70 may be coupled together.

A base of transistors 58, 64, 66, and 72 may be coupled to receive the control voltage output by first control voltage circuit 18 of control circuit 12. Additionally, a base of each of transistors 60, 62, 68 and 70 may be coupled to receive a second control voltage from second control voltage generating circuit 20 of control circuit 12. Finally, gain cell 14 may provide an output differential voltage between a collector of transistor 60 and a collector of transistor 70.

In operation, an input differential voltage is applied to the base of transistors 48 and 50. Control circuit 12 generates an appropriate control signal to adjust the current flow in resistors 52, 82, and 84. Thereby, the gain of gain cell 14 is exponentially related to the control signal applied to circuit 16 of control circuit 12.

The relationship between the control current generated by circuit 16 and the gain of system 10 is described below. First, the gain of gain cell 14 is calculated as a function of first and second control voltages, VG1 and VG2. Next, the relationship between the differential voltage, VG2-VG1, and the output of circuit 16 is calculated. Finally, the results of the first two steps are used to demonstrate the exponential relationship between the output of circuit 16 and the gain of system 10.

I. GAIN OF GAIN CELL 14

The following definitions will be used in calculating the gain of gain cell 14:

VID (Input differential voltage)=VINX−VINY
C=(VG1-VG2)/VT
Where VT=Thermal Voltage=kT/q
 k=Boltzmann's Constant
 q=Electron Charge
 T=Temperature To relate the input differential voltage to the output differential voltage in terms of VG1 and VG2, it is necessary to calculate several currents in gain cell 14. First, the currents in transistors 48 and 50, labeled IX and IY respectively, are:

$$IX = IB + (VID/RX) \quad (1)$$

$$IY = IB - (VID/RX) \quad (2)$$

Next, the current through transistors 60 and 64 may be derived. Application of Kirkoff's voltage law shows that:

$$VG2 - VBE62 + VBE64 - VG1 = 0 \quad (3)$$

In Equation (3), VBE means the voltage between the base and emitter of the specified transistor. Equation (3) may be modified to be:

$$VG2 - VT\ln\frac{I1A}{IS} + VT\ln\frac{IF}{IS} - VG1 = 0 \quad (4)$$

Rearranging the terms of Equation (4) shows that:

$$VG2 - VG1 = VT\ln\frac{I1A}{IF} \quad (5)$$

Equation (5) may be further simplified to show:

$$I1A = IF \exp\frac{(VG2 - VG1)}{VT} \quad (6)$$

Applying Kirkoff's current law to the node connecting the emitter of transistors 62 and 64 shows that:

$$IX = IE1 + IE2 \quad (7)$$

If the $\beta$ value for each of transistors 62 and 64 is sufficiently high, the collector current for each transistor is approximately equal to the emitter current. Therefore, Equation (6) may be modified to show that:

$$IX = I1A + IF \quad (8)$$

Equations (1) and (6) may substitute into Equation (8) to derive an Equation for I1A:

$$I1A = \frac{IB + (VID/RX)}{1 + \exp(-C)} \quad (9)$$

In Equation (9), C is equal to (VG2−VG1)/VT. The same derivation may be applied to transistors 58 and 60. In this case, I1B is equal to IF of Equation (8). Therefore, the current through transistor 60 equals:

$$I1B = \frac{IB}{1 + \exp(C)} \quad (10)$$

The current through resistor 82 may be shown as:

$$I1 = I1A + I1B = \frac{IB + (VID/RX)}{1 + \exp(-C)} + \frac{IB}{1 + \exp(C)} \quad (11)$$

Equation (11) may be simplified to show that:

$$I1 = IB + \frac{VID}{RX * (1 + \exp(-C))} \quad (12)$$

Similarly, it can be shown that:

$$I2 = IB - \frac{VID}{RX * (1 + \exp(-C))} \quad (13)$$

To complete the gain calculation, the output differential voltage may be calculated. The two output voltages are:

$$VO1 = VCMF - (I1*R3) \quad (14)$$

and $$VO2 = VCMF - (I2*R4) \quad (15)$$

The differential output of gain cell 14 may be shown as $$VOD = VO1 - VO2 \quad (16)$$

If resistors 82 and 84 are both set equal to a value of RA, the output differential voltage is as follows:

$$VOD = (VCMF - I1*RA) - (VCMF - I2*RA) = RA * (I1 - I2) \quad (17)$$

Substituting Equations (12) and (13) into Equation (17) shows that:

$$VOD = RA * \left( IB - \frac{VID}{RX * (1 + \exp(-C))} - \right. \quad (18)$$

$$\left. IB - \frac{VID}{RX * (1 + \exp(-C))} \right)$$

Equation (17) may be reduced to show the gain of gain cell 14 in terms of the control voltages, VG2 and VG1:

$$\frac{VOD}{VID} = \frac{2*RA}{RX * (1 + \exp[(VG2 - VG1)/VT])} \quad (19)$$

II. VG2−VG1 IN TERMS OF IDAC

This section uses the following assumptions and definitions:

Is = Saturation current of a 1 uM × 1 uM NPN device
Transistor 42 is 1 uM by 10 uM
Transistor 36 is 1 uM by 14 uM
VT = Thermal Voltage = kT/q
VDG = Differential gain control voltage = VG2−VG1

If the voltage at the base of transistor 24 is set, for example at 2.5 V, then the current through resistors 44 and 46 is:

$$IR44 = \frac{2.5V}{10K} = 250uA \quad (20)$$

The current of Equation (20) may be used to calculate VG1:

$$VG1 = 2.5V + IR44*R44 = 3.0 V \quad (21)$$

The voltage labeled VX is one diode drop above the potential of VG1:

$$VX = VG1 + VBE42 = 3.0 + VT \ln\left(\frac{250uA}{10*IS}\right) \quad (22)$$

Similarly, the voltage labeled VZ is one diode drop below VX:

$$VZ = VX - VBE36 = 3.0 + \quad (23)$$

$$VT \ln\left(\frac{250uA}{10*IS}\right) - VT \ln\left(\frac{IDAC + IBIAS}{14*IS}\right)$$

Equation (23) reduces to:

$$VZ = 3.0 + VT \ln\left(\frac{350uA}{IDAC + IBIAS}\right) \quad (24)$$

The second control voltage is:

$$VG2 = VZ - (IDAC * RB) = 3.0 + \quad (25)$$

$$VT \ln\left(\frac{350uA}{IDAC + IBAS}\right) - (IDAC * RB)$$

Combining Equations (21) and (25) shows that the relationship between the control voltages and IDAC:

$$VG2 - VG1 = VT \ln\left(\frac{350uA}{IDAC + IBIAS}\right) - (IDAC * RB) \quad (26)$$

III. GAIN AS A FUNCTION OF IDAC.

The result of Equation (26) may be substituted into Equation (19) to derive the gain as a function of IDAC:

$$Gain = \frac{2 * RA}{RX * \left(1 + \exp\left[\ln\left(\frac{350uA}{IDAC + IBIAS}\right) - \frac{IDAC * RB}{VT}\right]\right)} \quad (27)$$

Equation (27) may be simplified to show:

$$Gain = \frac{2 * RA * \exp\left(\frac{IDAC * RB}{VT}\right)}{RX * \left[\exp\left(\frac{IDAC * RB}{VT}\right) + \frac{350uA}{IDAC + IBIAS}\right]} \quad (28)$$

The invariance of circuit 10 with respect to temperature may be understood by analyzing Equation (28). The current IDAC is proportional to VT/R. Therefore, the term (IDAC×RB)/VT is not dependent on the temperature of the operating environment. Further, IBIAS and the current source which generates the 350 uA are both proportional to VT/R as well. Therefore, the 340 uA/-(IDAC+IBIAS) term is also not affected by the temperature of the operating environment.

IV. OBTAINING AN EXPONENTIAL RESPONSE

To establish that circuit 10 does provide an exponential response, first consider two cases. In the first case, the assumption is made that:

$$\exp\left(\frac{IDAC * RB}{VT}\right) >> \frac{350uA}{IDAC + IBIAS} \quad (29)$$

In this case, the denominator of Equation (28) is dominated by the exponential term, and Equation (28) reduces to:

$$Gain = \frac{2 * RA * \exp\left(\frac{IDAC * RB}{VT}\right)}{RX * \exp\left(\frac{IDAC * RB}{VT}\right)} = \frac{2 * RA}{RX} \quad (30)$$

Therefore, in this case the gain is a constant value. The second case is the opposite of the first case. In this case it is assumed that:

$$\exp\left(\frac{IDAC * RB}{VT}\right) << \frac{350uA}{IDAC + IBIAS} \quad (31)$$

In this case, the denominator of Equation (28) is dominated by the linear term. Therefore, Equation (28) may be simplified to show:

$$Gain = \frac{2 * RA}{RX} * (IDAC + IBIAS) * \exp\left(\frac{IDAC * RB}{VT}\right) \quad (32)$$

Equation (32) may be referred to as "super-exponential". Equation (32) increases faster than an exponential due to the presence of the multiplier term (IDAC+IBIAS). Note that if IBIAS>>IDAC, Equation (32) would approximately be equal to:

$$Gain = \frac{2 * RA}{RX} * IBIAS * \exp\left(\frac{IDAC * RB}{VT}\right) \quad (33)$$

To generate an exponential relationship between the gain and the current Idac, a circuit that operates between the two cases may be used. Appropriate resistor values may be chosen to assure that circuit 10 operates to provide an exponential response.

Although the present invention has been described in detail, various changes, substitutions and alterations may be made hereto without departing from the spirit and scope of the invention as defined by the appended claims.

What is claimed is:

1. A system for controlling a gain circuit, comprising:
   circuitry for generating a control current;
   circuitry for establishing a reference voltage;
   circuitry responsive to said control current generating circuitry and said establishing circuitry for generating a first output control voltage;
   circuitry responsive to said establishing circuitry for generating a second output control voltage wherein said first and second control voltages are operable to provide a differential control signal related to said control current to the gain circuit such that the gain of the gain circuit is exponentially related to said control current.

2. The system of claim 1, and further comprising circuitry coupled to said current generating circuitry for receiving a digital code word logarithmicly related to a predetermined gain of the gain circuit.

3. The system of claim 1, wherein said control current generating circuitry comprises a digital to analog converter for converting a digital code word to a control current.

4. The system of claim 1, wherein said first voltage generating circuitry comprises:
   an NPN bipolar junction transistor having a base, a collector and an emitter, said base coupled to said collector and said second voltage generating circuitry; and
   a resistor coupled between said emitter and said control current generating circuitry.

5. The system of claim 1, wherein said second voltage generating circuitry comprises:
   an NPN bipolar junction transistor having a base, a collector and an emitter, said base coupled to said collector and said first voltage generating circuitry;

a first resistor having first and second ends, said first end coupled to said emitter and said second end coupled to said reference voltage establishing circuitry; and a second resistor coupled to said second end of said first resistor.

6. The system of claim 1, wherein:

said first voltage generating circuitry comprises:

an NPN bipolar junction transistor having a base, a collector and an emitter, said base coupled to said collector and said second voltage generating circuitry; and a resistor coupled between said emitter and said control current generating circuitry; and said second voltage generating circuitry comprises:

an NPN bipolar junction transistor having a base, a collector and an emitter, said base coupled to said collector and said first voltage generating circuitry;

a first resistor having first and second ends, said first end coupled to said emitter and said second end coupled to said reference voltage establishing circuitry; and a second resistor coupled to said second end of said first resistor.

7. The system of claim 1, wherein said reference voltage establishing circuitry comprises:

a first NPN bipolar junction transistor having a base, a collector and an emitter, a voltage applied at said base;

a second NPN bipolar junction transistor having a base, a collector and an emitter, said emitter coupled to said emitter of said first transistor;

a current mirror coupled to said collector of each of said first and second transistors; and a current source coupled to said emitter of each of said first and second transistors wherein said voltage applied at said base of said first transistor is replicated at said base of said second transistor to provide said reference voltage to said circuitry for establishing said second control voltage.

8. A gain circuit, comprising:

a gain cell having a differential control input;

circuitry for generating a control current;

circuitry for establishing a reference voltage;

circuitry responsive to said control current generating circuitry and said establishing circuitry for generating a first output control voltage;

circuitry responsive to said establishing circuitry for generating a second output control voltage wherein said first and second control voltages are operable to provide a differential control signal related to said control current to said gain cell such that the gain of the gain circuit is exponentially related to said control current.

9. The system of claim 8, and further comprising circuitry coupled to said current generating circuitry for receiving a digital code word logarithmicly related to a predetermined gain of the gain circuit.

10. The system of claim 8, wherein said control current generating circuitry comprises a digital to analog converter for converting a digital code word to a control current.

11. The system of claim 8, wherein said first voltage generating circuitry comprises:

an NPN bipolar junction transistor having a base, a collector and an emitter, said base coupled to said collector and said second voltage generating circuitry; and a resistor coupled between said emitter and said control current generating circuitry.

12. The system of claim 8, wherein said second voltage generating circuitry comprises:

an NPN bipolar junction transistor having a base, a collector and an emitter, said base coupled to said collector and said first voltage generating circuitry;

a first resistor having first and second ends, said first end coupled to said emitter and said second end coupled to said reference voltage establishing circuitry; and a second resistor coupled to said second end of said first resistor.

13. The system of claim 8, wherein:

said first voltage generating circuitry comprises:

an NPN bipolar junction transistor having a base, a collector and an emitter, said base coupled to said collector and said second voltage generating circuitry; and a resistor coupled between said emitter and said control current generating circuitry; and said second voltage generating circuitry comprises:

an NPN bipolar junction transistor having a base, a collector and an emitter, said base coupled to said collector and said first voltage generating circuitry;

a first resistor having first and second ends, said first end coupled to said emitter and said second end coupled to said reference voltage establishing circuitry; and a second resistor coupled to said second end of said first resistor.

14. The system of claim 8, wherein said reference voltage establishing circuitry comprises:

a first NPN bipolar junction transistor having a base, a collector and an emitter, a voltage applied at said base;

a second NPN bipolar junction transistor having a base, a collector and an emitter, said emitter coupled to said emitter of said first transistor;

a current mirror coupled to said collector of each of said first and second transistors; and a current source coupled to said emitter of each of said first and second transistors wherein said voltage applied at said base of said first transistor is replicated at said base of said second transistor to provide said reference voltage to said circuitry for establishing said second control voltage.

15. The system of claim 8, wherein said gain cell comprises a Gilbert translinear circuit.

16. A method for controlling a gain circuit, comprising the steps of:

generating a control current;

establishing a reference voltage;

generating a first output control voltage proportional to the control current and the reference voltage;

generating a second output control voltage proportional to the reference voltage wherein the first and second control voltages are operable to provide a differential control signal related to the control current to the gain circuit such that the gain of the gain circuit is exponentially related to the control current.

17. The method of claim 16, and further comprising the step of receiving a digital code word logarithmicly related to the desired gain for the gain circuit.

18. The method of claim 16, wherein said step of generating a control current comprises the step of converting a digital code word to a proportional control current in a digital to analog converter.

19. The method of claim 16, wherein said step of generating a first voltage comprises the step of generating a first voltage in a circuit comprising an NPN bipolar junction transistor having a base, a collector and an emitter, the base coupled to the collector and a resistor coupled to said emitter such that the current generated in said control current generating step passes through the resistor.

20. The method of claim 16, wherein said step of generating a second voltage comprises the step of generating a second voltage in a circuit comprising an NPN bipolar junction transistor having a base, a collector and an emitter, said base coupled to said collector, a first resistor having first and second ends, said first end coupled to said emitter and a second resistor coupled to said second end of said first resistor such that the voltage generated in said reference voltage generating step is applied to the second end of said first resistor.

* * * * *